United States Patent
Inumiya et al.

(10) Patent No.: US 8,143,676 B2
(45) Date of Patent: Mar. 27, 2012

(54) SEMICONDUCTOR DEVICE HAVING A HIGH-DIELECTRIC-CONSTANT GATE INSULATING FILM

(75) Inventors: Seiji Inumiya, Yokohama (JP); Takuya Kobayashi, Yokohama (JP); Tomonori Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 12/261,770

(22) Filed: Oct. 30, 2008

(65) Prior Publication Data

US 2009/0114996 A1    May 7, 2009

(30) Foreign Application Priority Data

Oct. 31, 2007 (JP) .................................. 2007-283208

(51) Int. Cl.
*H01L 21/02* (2006.01)
(52) U.S. Cl. ................. 257/388; 257/412; 257/E21.285
(58) Field of Classification Search .................. 257/388, 257/412, E21.285
See application file for complete search history.

(56) References Cited

U.S. PATENT DOCUMENTS

| | | | |
|---|---|---|---|
| 7,375,403 B2 | 5/2008 | Kaneko et al. | |
| 2001/0023120 A1* | 9/2001 | Tsunashima et al. | 438/585 |
| 2005/0059198 A1* | 3/2005 | Visokay et al. | 438/199 |
| 2006/0131652 A1* | 6/2006 | Li | 257/350 |

OTHER PUBLICATIONS

Kaneko, A. et al., "Semiconductor Device and Method of Manufacturing the Same," U.S. Appl. No. 12/081,824, filed Apr. 22, 2008.
Lee, K. L. et al., "Poly-Si/AlN/HfSiO Stack for Ideal Threshold Voltage and Mobility in Sub-100 nm MOSFETs," 2006 Symposium on VLSI Technology Digest of Technical Papers, p. 202 (2 sheets), (2006).
Alshareef, H. N. et al., "Thermally Stable N-Metal Gate MOSFETs Using La-Incorporated HfSiO Dielectric," 2006 Symposium on VLSI Technology Digest of Technical Papers, p. 10 (2 sheets), (2006).

* cited by examiner

*Primary Examiner* — Wael Fahmy
*Assistant Examiner* — John C Ingham
(74) *Attorney, Agent, or Firm* — Finnegan, Henderson, Farabow, Garrett & Dunner, L.L.P.

(57) ABSTRACT

A semiconductor device includes a substrate having first and second regions on a surface thereof, a first conductivity type first MISFET formed in the first region and a second conductivity type second MISFET formed in the second region. The first MISFET includes a silicon oxide film or a silicon oxynitride film formed on the surface of the substrate and a first insulating film which is formed in contact with the silicon oxide film or the silicon oxynitride film and which has a first element forming electric dipoles that reduce a threshold voltage of the first MISFET and the second MISFET includes a silicon oxide film or a silicon oxynitride film formed on the surface of the substrate, and a second insulating film which is formed in contact with the silicon oxide film or the silicon oxynitride film formed on the surface of the substrate and which has a second element forming electric dipoles in a direction opposite to that in the first MISFET.

6 Claims, 14 Drawing Sheets

SEMICONDUCTOR DEVICE HAVING A HIGH-DIELECTRIC-CONSTANT GATE INSULATING FILM

CROSS REFERENCE TO RELATED APPLICATION

This application claims benefit of priority under 35USC §119 to Japanese patent application No. 2007-283208, filed on Oct. 31, 2007, the contents of which are incorporated by reference herein.

BACKGROUND OF THE INVENTION

1. Field of the Invention

The present invention relates to a semiconductor device and a manufacturing method thereof, and is intended for, e.g., a semiconductor device including a CMISFET (Complementary Metal Insulator semiconductor Field Effect Transistor) having a high-dielectric-constant gate insulating film.

2. Related Background Art

In a semiconductor device including an MISFET, a reduction in film thickness of a gate insulating film involved by miniaturization directly increases a tunneling current, and a conventionally utilized silicon oxide film or silicon oxynitride film is confronted with a physical limit in a reduction in film thickness thereof. To achieve both suppression of a leakage current and a reduction in effective film thickness of a gate insulting film, a so-called High-k gate insulating film technology that uses a high-dielectric-constant material such as a hafnium oxide ($HfO_2$) or a hafnium silicon oxynitride (HfSiON) for a gate insulating film has been proposed.

However, when a hafnium oxide ($HfO_2$) or a hafnium silicon oxynitride (HfSiON) is used for the gate insulating film, a problem that a threshold value expected from a work function inherent to an electrode material cannot be obtained is a serious obstacle in practical use of an Hf-based High-k gate insulating film. This phenomenon occurs not only in a case using a polysilicon electrode but also a case using a metal electrode. Giving an explanation while taking an MOS (Metal Oxide Semiconductor) transistor as an example, a threshold voltage of an nMOS is increased when a material having a small work function is used to obtain a low threshold voltage in the nMOS, and (an absolute value of) a threshold voltage of a pMOS is increased when a material having a high work function is used to obtain (an absolute value of) a low threshold voltage in the pMOS.

Thus, there has been proposed a technology that uses a cap layer of, e.g., a lanthanum oxide ($La_2O_3$) on an Hf-based High-k insulating film to reduce a threshold voltage Vth of an nMOS or a technology that uses a cap layer of, e.g., $Al_2O_3$ on the Hf-based High-k insulating film to reduce a threshold voltage of a pMOS.

However, when simultaneously adopting both the technologies to realize a CMOS is tried, there is a problem that performing realistic integration is difficult. For example, one of the cap layers must be removed from one of the nMOS and the pMOS on the Hf-based High-k gate insulating film, and the other cap layer must be fully deposited and then delaminated from the other of the nMOS and the pMOS.

SUMMARY OF THE INVENTION

According to a first aspect of the present invention, there is provided a semiconductor device comprising:

a substrate having first and second regions on a surface thereof;

a first conductivity type first MISFET formed in the first region and includes a silicon oxide film or a silicon oxynitride film formed on the surface of the substrate, and a first insulating film which is formed in contact with the silicon oxide film or the silicon oxynitride film and which has a first element forming electric dipoles that reduce a threshold voltage of the first MISFET; and a second conductivity type second MISFET formed in the second region and includes a silicon oxide film or a silicon oxynitride film formed on the surface of the substrate, and a second insulating film which is formed in contact with the silicon oxide film or the silicon oxynitride film formed on the surface of the substrate and which has a second element forming electric dipoles in a direction opposite to that in the first MISFET.

According to a second aspect of the present invention, there is provided a manufacturing method of a semiconductor device comprising first conductivity type and second conductivity type MISFETs, the method comprising:

forming a first silicon oxide film or silicon oxynitride film on a surface of a substrate having a first region where the first conductivity type MISFET is to be formed and a second region where the second conductivity type MISFET is to be formed;

forming on the entire surface a first insulating film which contains a first element forming electric dipoles that reduce a threshold voltage of the first MISFET when brought into contact with the first silicon oxide film or silicon oxynitride film;

selectively removing the first insulating film and the first silicon oxide film or silicon oxynitride film in the first region;

forming a second silicon oxide film or silicon oxynitride film in the first region on the surface of the substrate; and forming on the entire surface a second insulating film which contains a second element forming electric dipoles in a direction opposite to that in the first MISFET when brought into contact with the second silicon oxide film or silicon oxynitride film.

According to a third aspect of the present invention, there is provided a manufacturing method of a semiconductor device comprising first conductivity type and second conductivity type MISFETs, the method comprising:

forming a first silicon oxide film or silicon oxynitride film on a surface of a substrate having a first region where the first conductivity type MISFET is to be formed and a second region where the second conductivity type MISFET is to be formed;

forming on the entire surface a first insulating film which contains a first element forming electric dipoles that reduce a threshold voltage of the first MISFET when brought into contact with the first silicon oxide film or silicon oxynitride film;

selectively removing the first insulating film and the first silicon oxide film or silicon oxynitride film in the second region;

forming a second silicon oxide film or silicon oxynitride film in the second region on the surface of the substrate; and forming on the entire surface a second insulating film which contains a second element forming electric dipoles in a direction opposite to that in the first MISFET when brought into contact with the second silicon oxide film or silicon oxynitride film.

BRIEF DESCRIPTION OF THE DRAWINGS

In accompanying drawings.

DETAILED DESCRIPTION OF THE INVENTION

Figure 1:
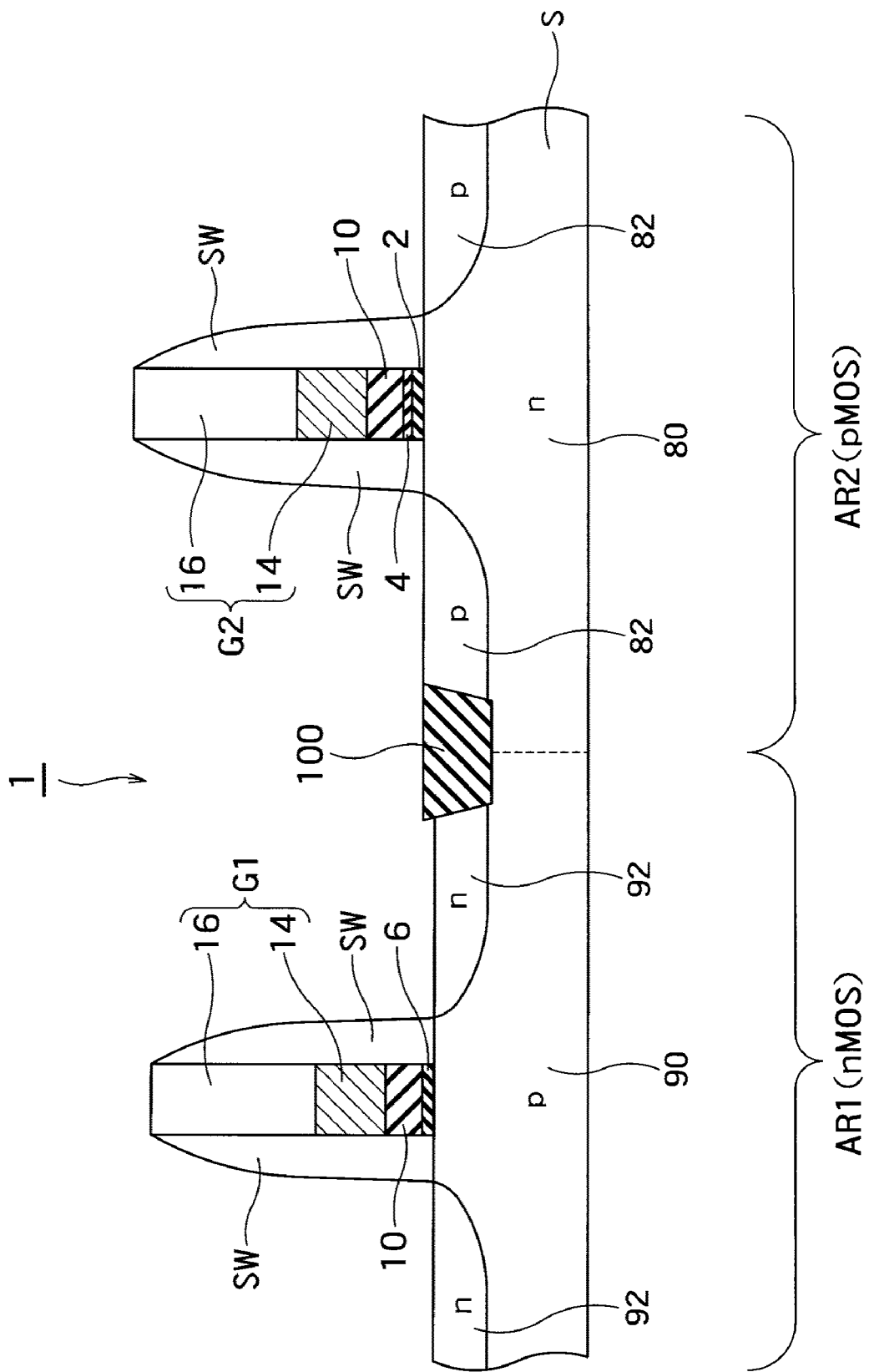
FIG. 1 is a schematic cross-sectional view showing an outline structure of a semiconductor device according to a first embodiment of the present invention.

Several embodiments according to the present invention will now be explained with reference to the accompanying drawings. In the following respective drawings, like reference numerals denote like parts, thereby appropriately omitting a tautological explanation thereof. It is to be noted that each drawing is not necessarily a drawing with an accurate reduction scale, and it should be noted that each drawing is partially enlarged or reduced in size and a horizontal to vertical ratio is changed for the convenience's sake.

(1) First Embodiment (A) Semiconductor Device

FIG. 1 is a schematic cross-sectional view showing an outline structure of a semiconductor device according to a first embodiment of the present invention. The semiconductor device 1 depicted in FIG. 1 includes an nMOS formed in a first region AR1 on a surface of a p-type semiconductor substrate S subjected to device isolation by a device isolation insulating film 100 formed of an STI (Shallow Trench Isolation) and a pMOS formed in a second region AR2. These nMOS and pMOS correspond to, e.g., a first conductivity type first MISFET and a second conductivity type second MISFET in this embodiment, respectively.

In the first region AR1, a p well 90 is formed in a surface layer of the p semiconductor substrate S, and a high-dielectric-constant gate insulating film 10, a gate stack structure of a gate electrode G1, and a sidewall SW are formed above the p well 90 via a thin gate insulting film 6. In the surface layer of the p well 90, n-type impurity diffusion layers 92 are formed to sandwich the region on which the gate stack structure and the sidewall SW are formed.

The thin gate insulating film 6 is formed of a silicon oxide film ($SiO_2$) in this embodiment, but the present invention is not restricted thereto, and it may be formed of, e.g., a silicon oxynitride film (SiON).

The high-dielectric-constant gate insulating film 10 is formed of a hafnium lanthanum silicon oxynitride (HfLaSiON) in this embodiment, and functions to reduce a threshold voltage Vth of the nMOS. The high-dielectric-constant gate insulating film 10 is not restricted to the hafnium lanthanum silicon oxynitride (HfLaSiON), and it may be an insulating film containing a rare-earth element or a second group element and hafnium or zirconium. The high-dielectric-constant gate insulating film 10 corresponds to, e.g., a first insulating film in this embodiment.

The gate electrode G1 is formed of a laminated body including a titanium nitride (TiN) film 14 and a polysilicon film 16.

In the second region AR2, an n well 80 is formed in the surface layer of the p semiconductor substrate S, and an aluminum oxide ($Al_2O_3$) film 4, the high-dielectric-constant gate insulating film 10, a gate stack structure of a gate electrode G2, and the sidewall SW are formed above the n well 80 via a gate insulating film 2. In the surface layer of the n well 80, p-type impurity diffusion layers 82 are formed to sandwich the region on which the gate stack structure and the sidewall SW are formed. The aluminum oxide ($Al_2O_3$) film 4 is formed with a film thickness of 0.5 nm to reduce a threshold voltage Vth of the pMOS in this embodiment. In this embodiment, the aluminum ($Al_2O_3$) film 4 corresponds to a second insulating film.

This embodiment is characterized in that the very thin aluminum oxide ($Al_2O_3$) film 4 is inserted between the gate insulating film 2 and the high-dielectric-constant gate insulting film 10 in the second region AR2 and thereby formed in a layer different from the layer where the high-dielectric-constant gate insulating film 10 which is in contact with the gate insulating film 2 is formed in the first region AR1. Consequently, a reduction in threshold voltage (an absolute value) is realized in both the nMOS and the PMOS, and realization of high performances and a reduction in power consumption can be achieved in the semiconductor device including the high-dielectric-constant gate insulating film 10 and the metal gate electrode. Further, both the nMOS and the pMOS can have the same metal electrode and can be simultaneously processed, thereby enabling manufacture at a low cost.

(B) Manufacturing Method of Semiconductor Device

A manufacturing method of the semiconductor device depicted in FIG. 1 will now be explained with reference to FIGS. 2 to 12.

Figure 2:
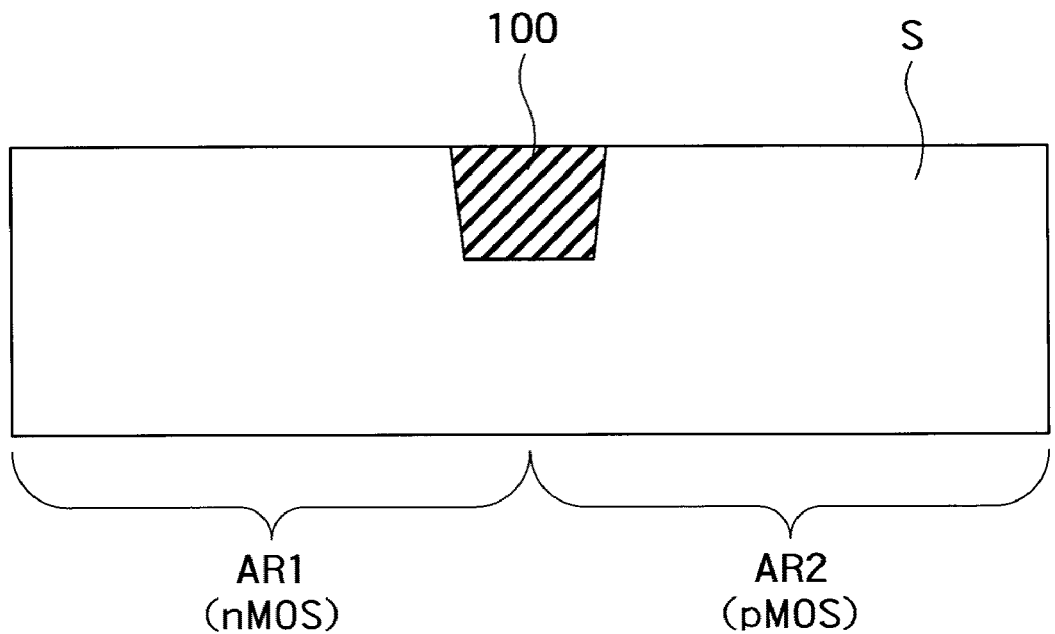
FIGS. 2 to 12 are schematic cross-sectional views for explaining a manufacturing method of the semiconductor device depicted in FIG. 1.

First, as shown in FIG. 2, a device isolation insulating film 100 is formed in a surface layer of a p-type semiconductor substrate S1 by using an STI (Shallow Trench Isolation) technology. Here, although not shown, a p well is formed in a surface portion of the first region AR1 in the p-type semiconductor substrate S1, and an n well is formed in a surface portion of the second region AR2 in the p-type semiconductor substrate S1.

Figure 3:
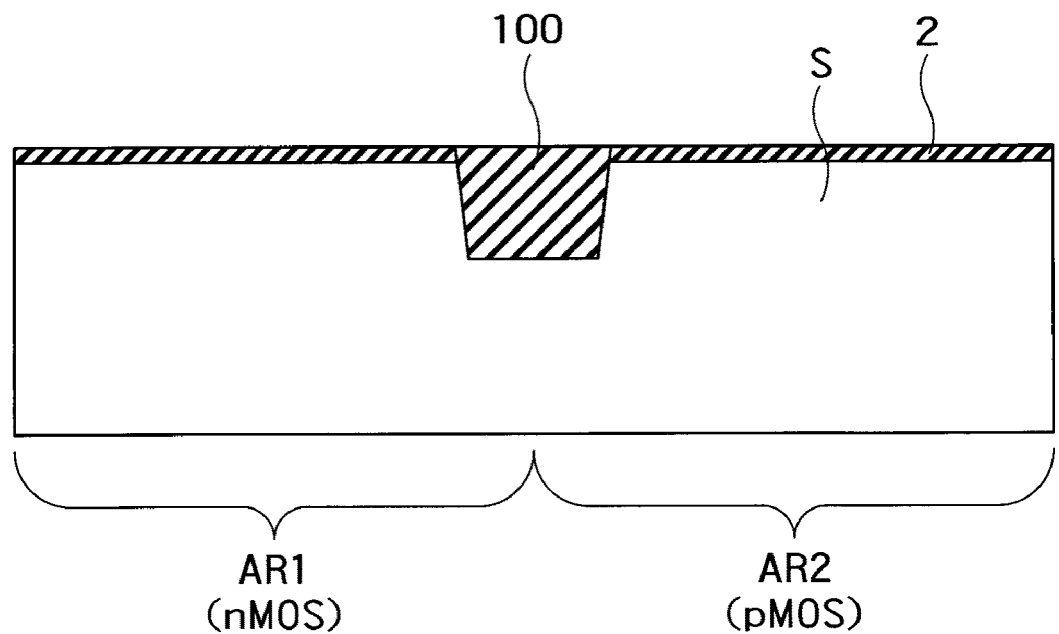

Then, as shown in FIG. 3, a silicon oxide film 2 having a thickness of approximately 0.6 nm is formed on a surface of the p-type semiconductor substrate S1 by using a thermal oxidation treatment or an ozone water oxidation treatment. Here, a silicon nitride film (SiON) may be formed in place of the silicon oxide film. The silicon oxide film 2 corresponds to, e.g., a first silicon oxide film or silicon oxynitride film in this embodiment.

Figure 4:
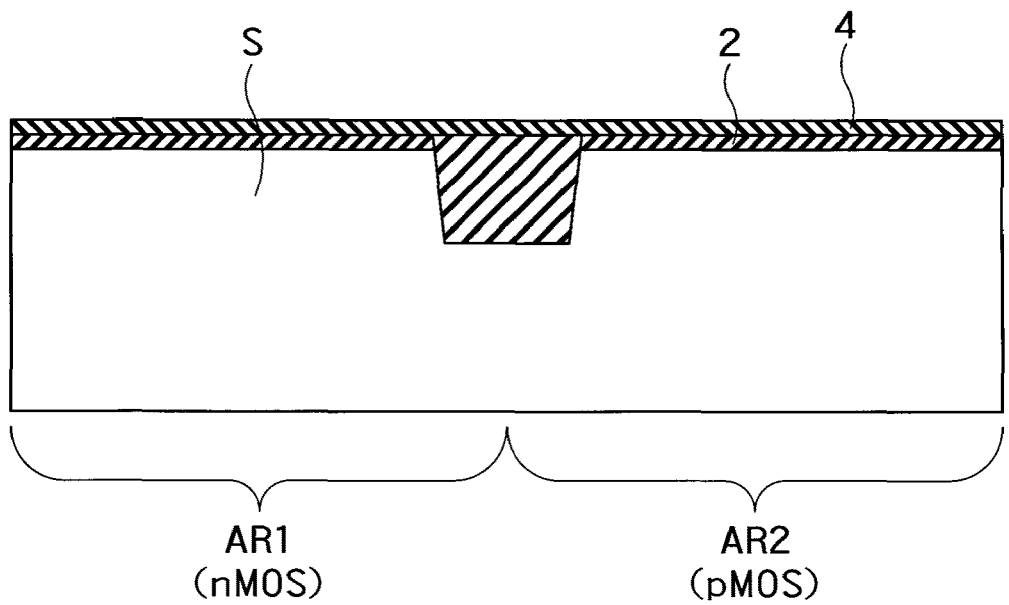

Then, as shown in FIG. 4, the aluminum oxide film 4 having a thickness of 0.5 nm is formed on the silicon oxide film 2 based on an ALD (Atomic Layer Deposition) method using trimethyl aluminum (($Al(CH_3)_3Al$):TMA) and water vapor ($H_2O$). The aluminum oxide film 4 corresponds to, e.g., a first insulating film in the manufacturing method of a semiconductor device according to this embodiment.

Figure 5:
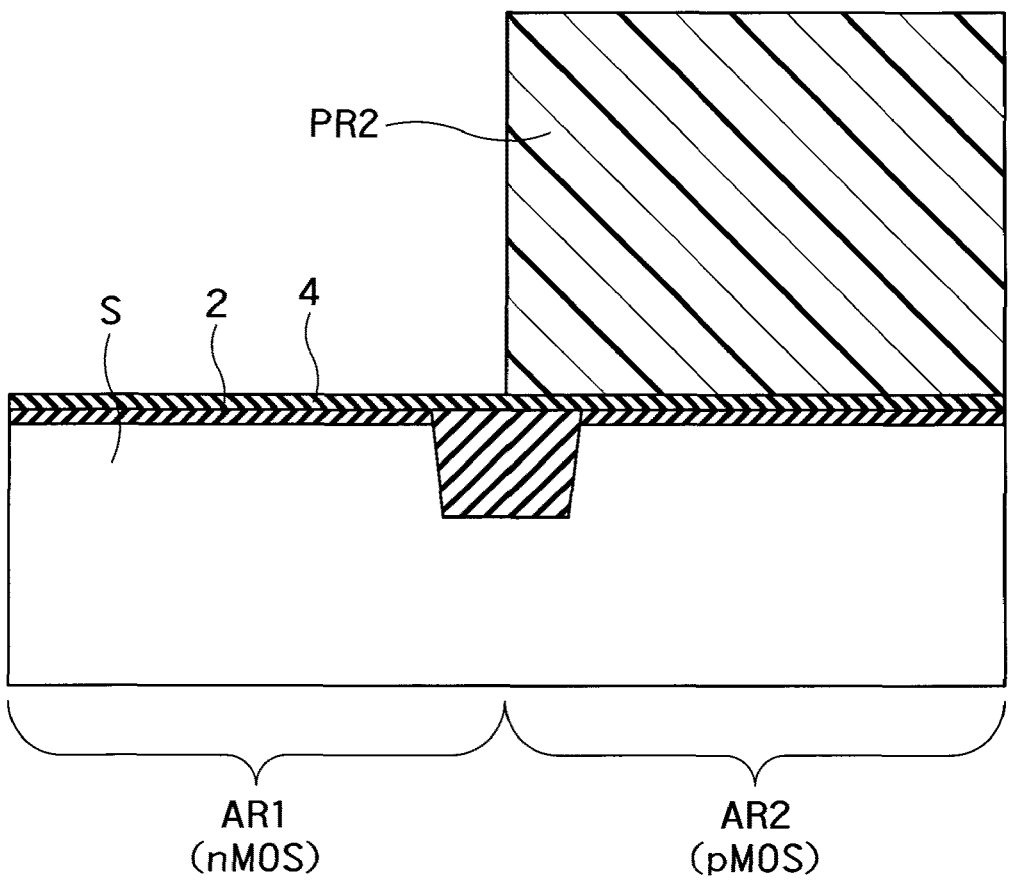
Figure 6:
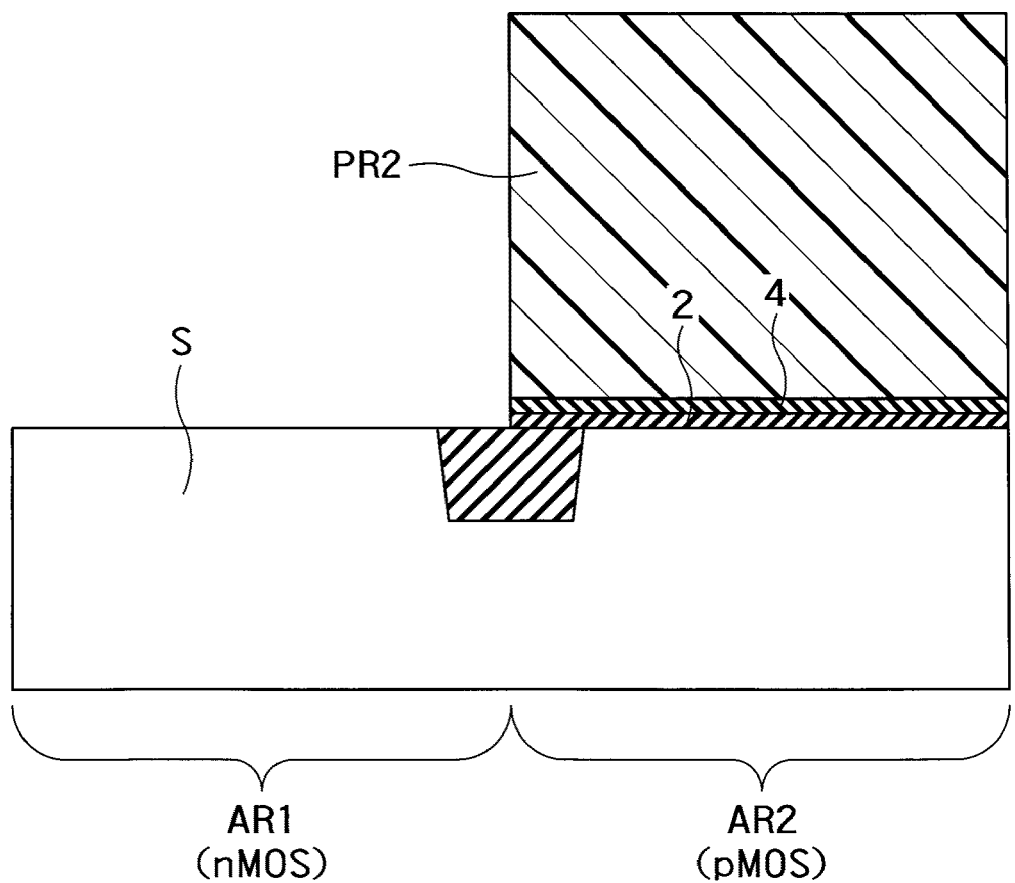

Subsequently, as shown in FIG. 5, a resist film is applied to an entire surface, then a photoresist PR2 that covers the second region AR2 is formed based on patterning using photolithography, and the aluminum oxide film 4 and the silicon oxide film 2 are selectively removed in the second region AR2 by using, e.g., a diluted hydrofluoric acid solution as shown in FIG. 6.

Figure 7:
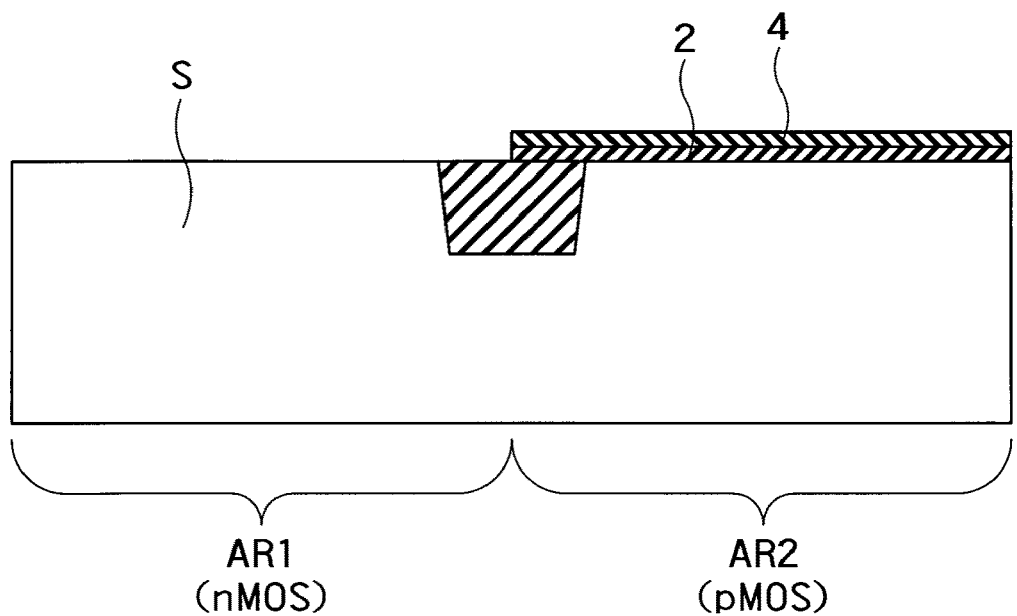
Figure 8:
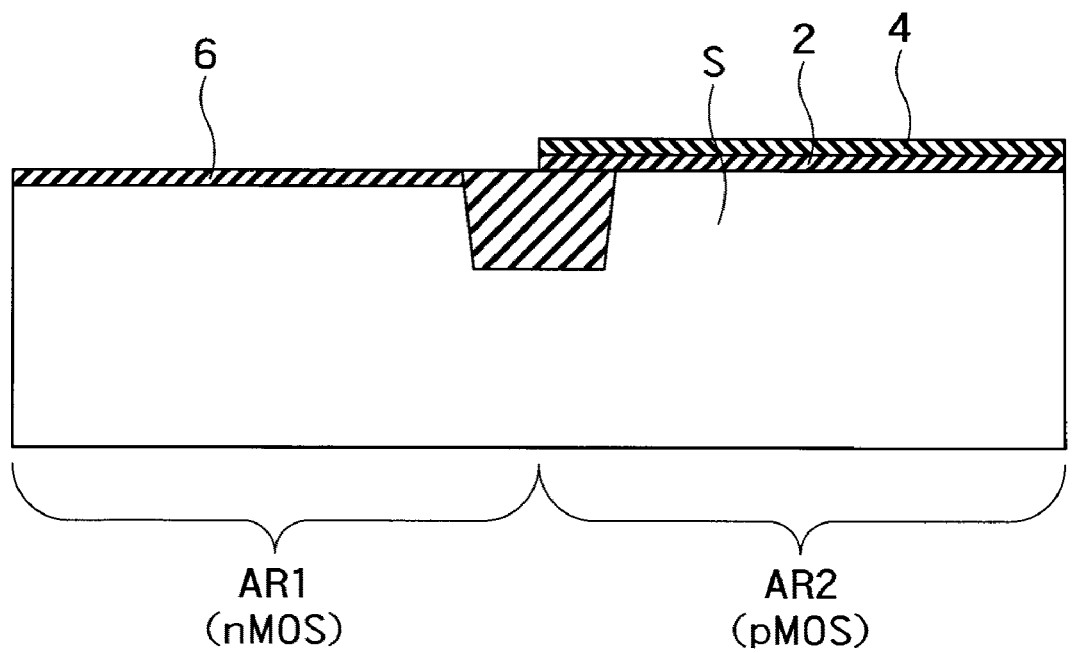

Then, the photoresist PR2 is removed by using, e.g., a thinner as shown in FIG. 7, and the thermal oxidation treatment or the ozone water oxidation treatment is again used to form a silicon oxide film 6 having a thickness of approximately 0.6 nm in the first region AR1 on the surface of the p-type semiconductor substrate S1 as shown in FIG. 8. Here, like the silicon oxidation film 2, a silicon nitride film (SiON)

may be formed in place of the silicon oxide film 6. The silicon oxide film 6 corresponds to, e.g., a second silicon oxide film or silicon oxynitride film in this embodiment.

Figure 9:
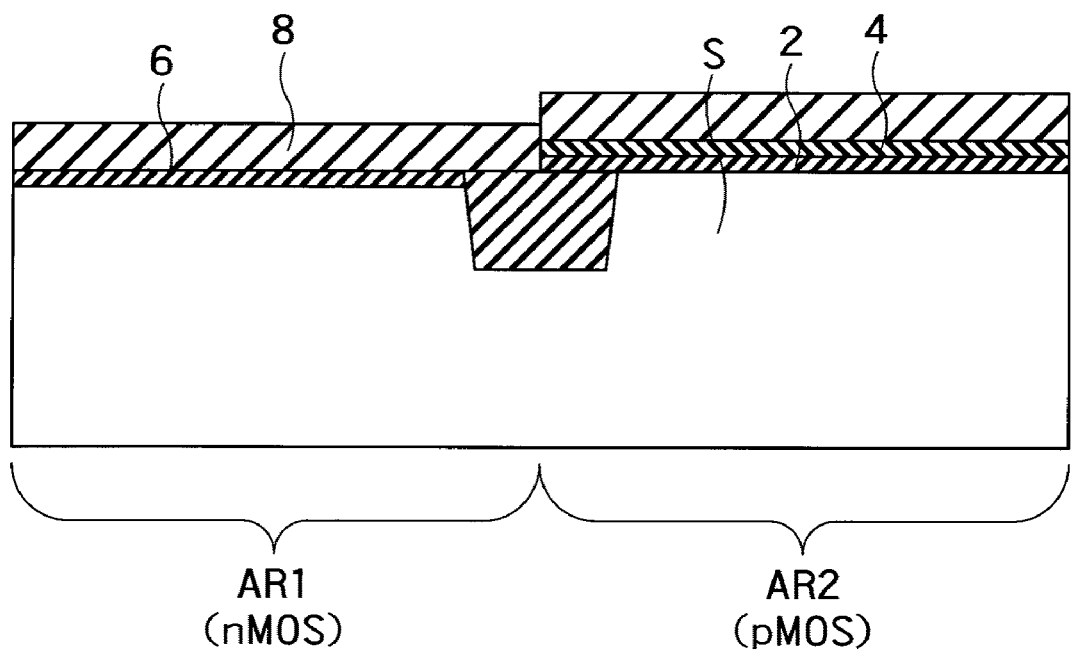

Then, a hafnium silicate (HfSiO) film having a thickness of approximately 2 nm is deposited on the entire surface, nitrogen is introduced by a plasma nitridation method, and a heat treatment is performed at a temperature of 1000° C. under a pressure of five Torr for 10 seconds to stabilize the introduced nitrogen, thereby forming a hafnium silicon oxynitride (HfSiON) film 8 on the entire surface as shown in FIG. 9. The hafnium silicon oxynitride (HfSiON) film 8 corresponds to, e.g., a second insulating film in the manufacturing method of a semiconductor device according to this embodiment.

Figure 10:
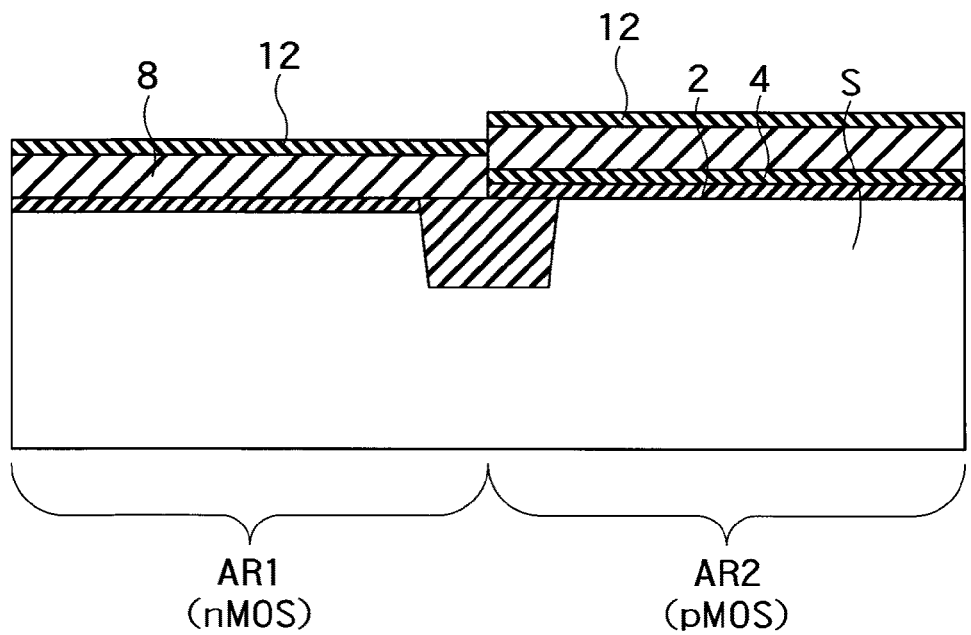

Subsequently, as shown in FIG. 10, a PVD (Physical Vapor Deposition) method or an ALD method is used to form a lanthanum oxide ($La_2O_3$) film 12 having a thickness of approximately 0.9 nm is deposited on the hafnium silicon oxynitride (HfSiON) film 8.

Figure 11:
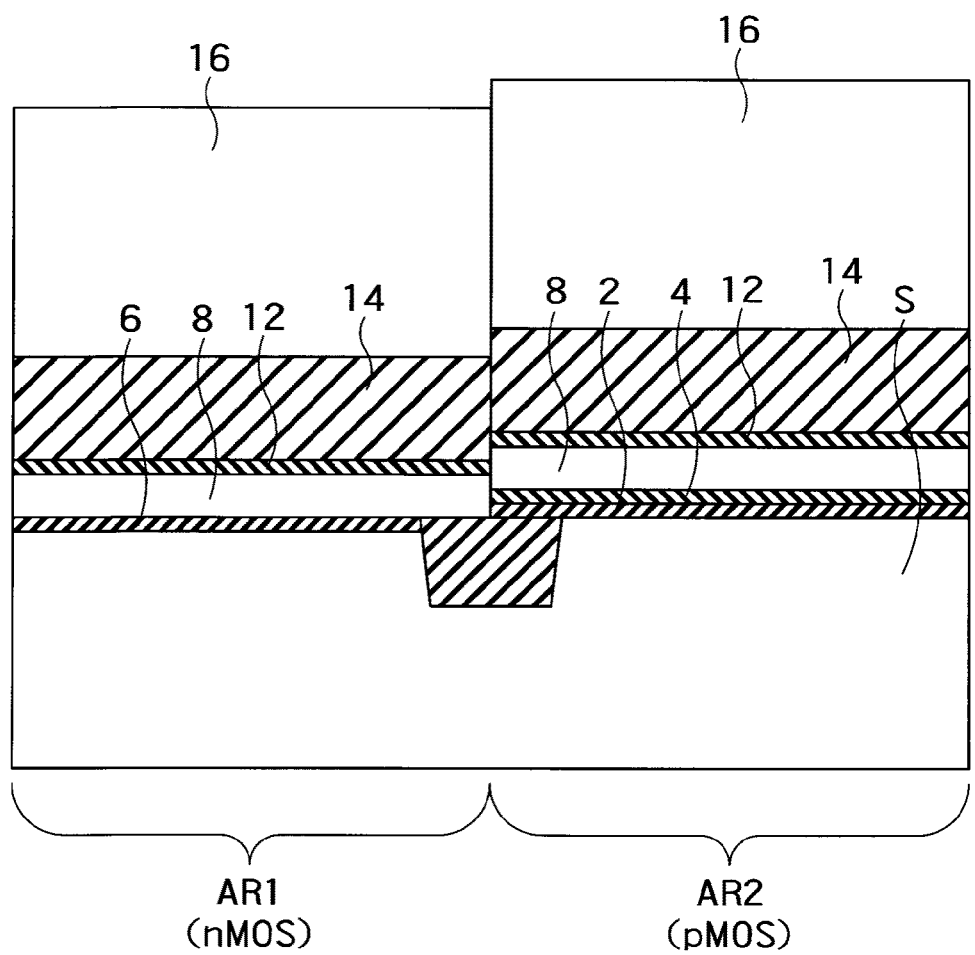
Figure 12:
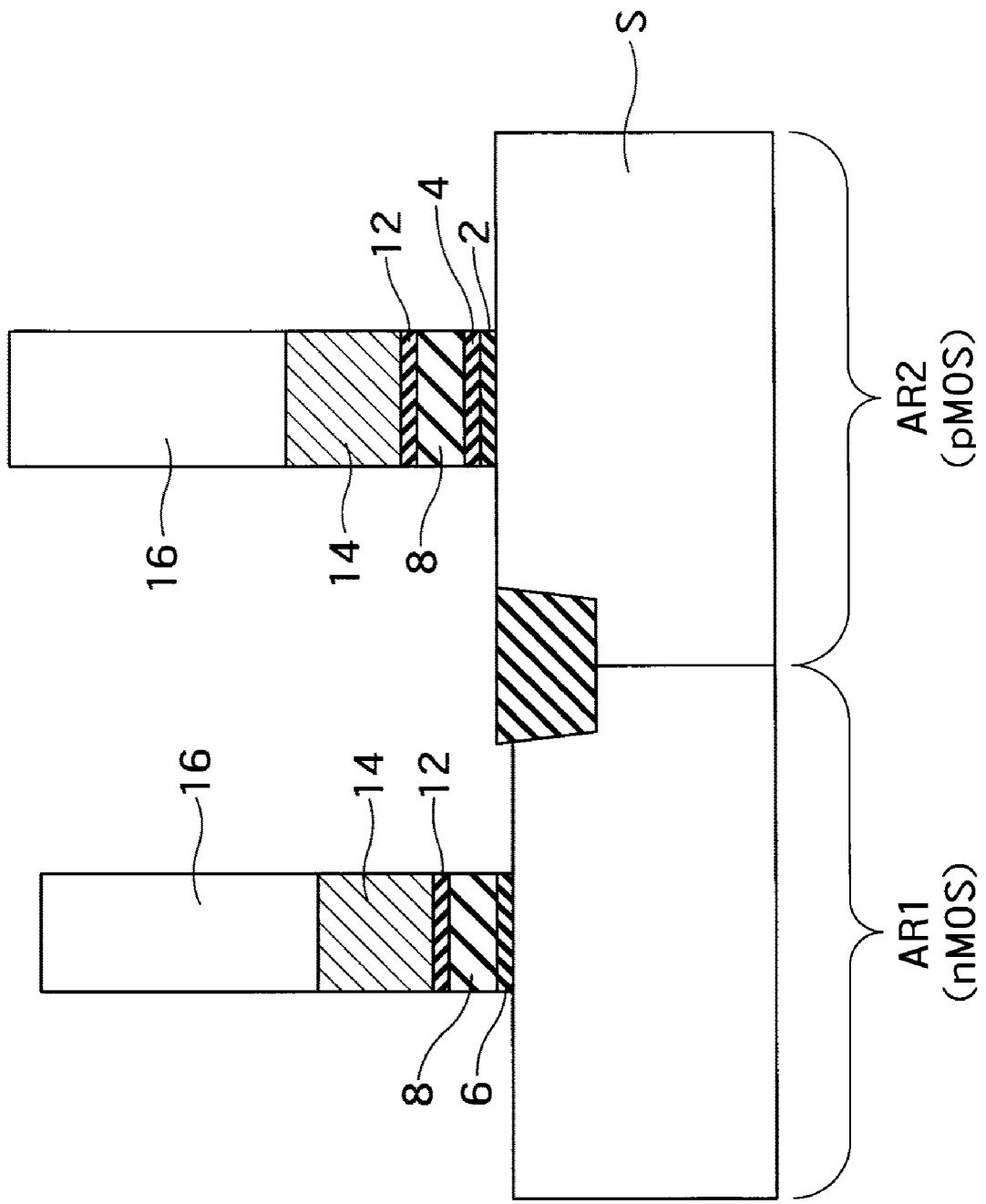

Furthermore, as shown in FIG. 11, the titanium nitride (TiN) film 14 having a thickness of 10 nm and the polysilicon film 16 having a film thickness of 70 nm which serve as a gate electrode are deposited on the lanthanum oxide ($La_2O_3$) film 12 and these films are processed into a gate electrode by an RIE (Reactive Ion Etching) method, thereby bringing a basic structure of a gate stack to completion as depicted in FIG. 12.

Thereafter, a regular process technology is used to form the sidewall SW, and an MOS type transistor is brought to completion like the semiconductor device 1 depicted in FIG. 1 through, e.g., ion implantation, an activation annealing process for formation of the impurity diffusion layers 82 and 92 as a source and a drain. With the thermal process explained thus far, the lanthanum oxide ($La_2O_3$) film deposited on the hafnium silicon oxynitride film (HfSiON) film 8 is diffused into the hafnium silicon oxynitride (HfSiON) film 8, and a hafnium lanthanum silicon oxynitride (HfLaSiON) film 10 is thereby formed as shown in FIG. 1. It is to be noted that, although not shown, an extension layer may be formed in a substrate surface layer below the sidewall SW.

In the nMOS, when lanthanum (La) in the hafnium lanthanum silicon oxynitride (HaLaSiON) film 10 comes into contact with the silicon oxide film 6, electric dipoles are formed, and a desired low threshold voltage Vth is realized with respect to the nMOS, thereby forming an nMOS transistor having high performances. On the other hand, in the pMOS, when the aluminum oxide film 4 comes into contact with the silicon oxide film 2, electric dipoles in a direction opposite to that in the nMOS is formed, and a desired low threshold voltage Vth (an absolute value) is realized in the pMOS. Diffusion of lanthanum (La) in the hafnium lanthanum silicon oxynitride (HfLaSiON) film 10 on the aluminum oxide film 4 is blocked by the aluminum oxide film 4 and contact with the silicon oxide film 2 is suppressed, and hence an increase in the threshold voltage Vth of the pMOS by lanthanum (La) is prevented.

Although the lanthanum oxide ($La_2O_3$) film remains on the second region AR2 in this embodiment, the lanthanum oxide ($La_2O_3$) film on the second region AR2 may be selectively removed.

Moreover, although the lanthanum oxide ($La_2O_3$) film is formed on the hafnium silicon oxynitride (HfSiON) film 8 in this embodiment, it may be deposited as a hafnium lanthanum silicate (HfLaSiO$_2$) film. Additionally, a hafnium silicate (HfSiO) film may be deposited after the lanthanum oxide ($La_2O_3$) film is deposited, and then a nitridation treatment and an annealing treatment may be carried out. At this time, the lanthanum oxide film ($La_2O_3$) deposited on the aluminum oxide ($Al_2O_3$) film 4 in the second region AR2 may be selectively removed.

Although the hafnium silicate (HfSiO) film is used to form the hafnium lanthanum silicon oxynitride (HfLaSiON) film 10 as the high-dielectric-constant gate insulating film in this embodiment, the present invention is not restricted thereto, and the same effect can be obtained when, e.g., a zirconium silicate (ZrSiO) film, a hafnium oxide film (HfO$_2$), a zirconium oxide (ZrO$_2$) film, a hafnium zirconium oxide film (HfZrO), or a hafnium zirconium silicate film (HfZrSiO) is used.

Further, although lanthanum is used as an element that forms the electric dipoles which reduces the threshold voltage Vth of the nMOS, the same effect can be obtained when any other rare-earth element or a second group element is used.

Furthermore, when a silicon germanium epitaxial layer serving as a part of a channel is selectively formed on the surface of the second region AR2 of the n-type silicon substrate S before forming the silicon oxide film 2, the threshold voltage Vth of the pMOS can be further reduced.

(2) Second Embodiment (A) Semiconductor Device

The above-explained gate stack structure can demonstrate the same effect even if the nMOS and the pMOS are counter-changed. Such a conformation will be explained as a second embodiment.

Figure 13:
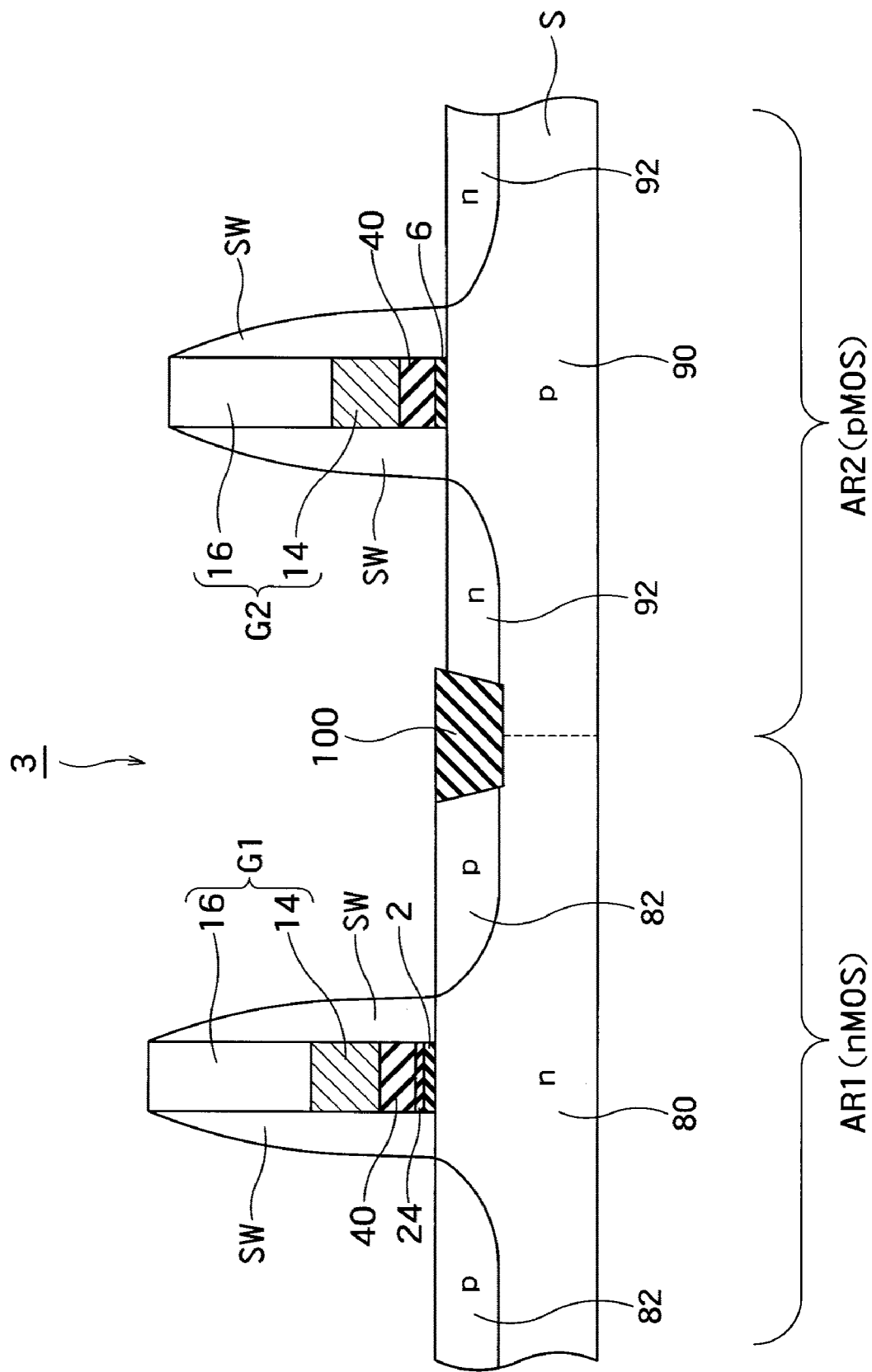
FIG. 13 is a schematic cross-sectional view showing an outline structure of a semiconductor device according to a second embodiment of the present invention.

FIG. 13 is a schematic cross-sectional view showing an outline structure of a semiconductor device according to the second embodiment of the present invention. As apparent from a comparison with FIG. 1, a semiconductor device 3 depicted in FIG. 13 has a structure where a gate structure of an nMOS formed in a first region AR1 on a surface of a p-type semiconductor substrate S and a gate structure of a pMOS formed in a second region AR2 are opposite to those in the semiconductor device 1 depicted in FIG. 1.

Specifically, in the first region AR1, a lanthanum oxide ($La_2O_3$) film 24, a high-dielectric-constant gate insulating film 40, a gate stack structure of a gate electrode G1, and a sidewall SW are formed above the p-type semiconductor substrate S via a gate insulating film 2. Furthermore, in the second region AR2, a high-dielectric-constant gate insulating film 40, a gate stack structure of a gate electrode G2, and a sidewall SW are formed above a p-type semiconductor substrate S via a thin gate insulating film 6. Each of the thin gate insulating films 2 and 6 is formed of a silicon oxide film (SiO$_2$) in this embodiment, but the present invention is not restricted thereto, and it may be formed of, e.g., a silicon oxynitride film (SiON).

The high-dielectric-constant gate insulating film 40 is formed of a hafnium aluminum silicon oxynitride (HfAlSiON) in this embodiment, and functions to reduce a threshold voltage Vth of the pMOS. The high-dielectric-constant gate insulating film 40 is not restricted to the hafnium aluminum silicon oxynitride (HfAlSiON), and an insulating film containing aluminum and hafnium or zirconium can suffice. The high-dielectric-constant gate insulating film 40 corresponds to, e.g., a first insulating film in this embodiment. The gate electrode G1 is formed of a laminated body including a titanium nitride film 14 and a polysilicon film 16.

In the first region AR1, the lanthanum oxide ($La_2O_3$) film 24 is formed with a film thickness of 0.3 nm to reduce a threshold voltage Vth of the nMOS in this embodiment. The lanthanum oxide ($La_2O_3$) film 24 corresponds to, e.g., a second insulating film in this embodiment.

In this embodiment, the very thin lanthanum oxide ($La_2O_3$) film 24 is inserted between the very thin gate insulating film 2 and the high-dielectric-constant gate insulating film 40 in the first region AR1 and thereby formed in a layer different from the layer in which the high-dielectric-constant gate insulating film 40 which is in contact with the gate insulating film 6 is formed in the second region AR2. As a result, a reduction in threshold voltage (an absolute value) is realized in both the nMOS and the pMOS, and realization of high performances and a reduction in power consumption can be achieved in the semiconductor device including the high-dielectric-constant gate insulating film 40 and the metal gate electrode. In this embodiment, the second insulating film inserted between the gate insulating film 2 and the high-dielectric-constant gate insulating film 40 in this embodiment is not restricted to the lanthanum oxide ($La_2O_3$) film, and an insulating film containing a rare-earth element or a second group element can suffice. Furthermore, like the first embodiment, in the semiconductor device 3 according to this embodiment, both the nMOS and the PMOS have the same metal electrode and can be simultaneously processed, thereby enabling manufacture at a low cost.

(B) Manufacturing Method of Semiconductor Device

A manufacturing method of the semiconductor device 3 depicted in FIG. 13 will now be explained with reference to FIGS. 14 to 22.

First, like the first embodiment, an STI (Shallow Trench Isolation) technology is used to form a device isolation insulating film 100 in the surface layer of the p-type semiconductor substrate S1, and a thermal oxidation process or an ozone water oxidation process is used to form the silicon oxide film 2 having a thickness of approximately 0.6 nm on the surface of the p-type semiconductor substrate S1 (see FIG. 2). Here, a silicon oxynitride film (SiON) may be formed in place of the silicon oxide film. It is to be noted that, although not shown, a p well 90 is formed in a surface portion of the first region AR1 of the p-type semiconductor substrate S1, and an n well 80 is formed in a surface portion of the second region AR2 of the p-type semiconductor substrate S1.

Figure 14:
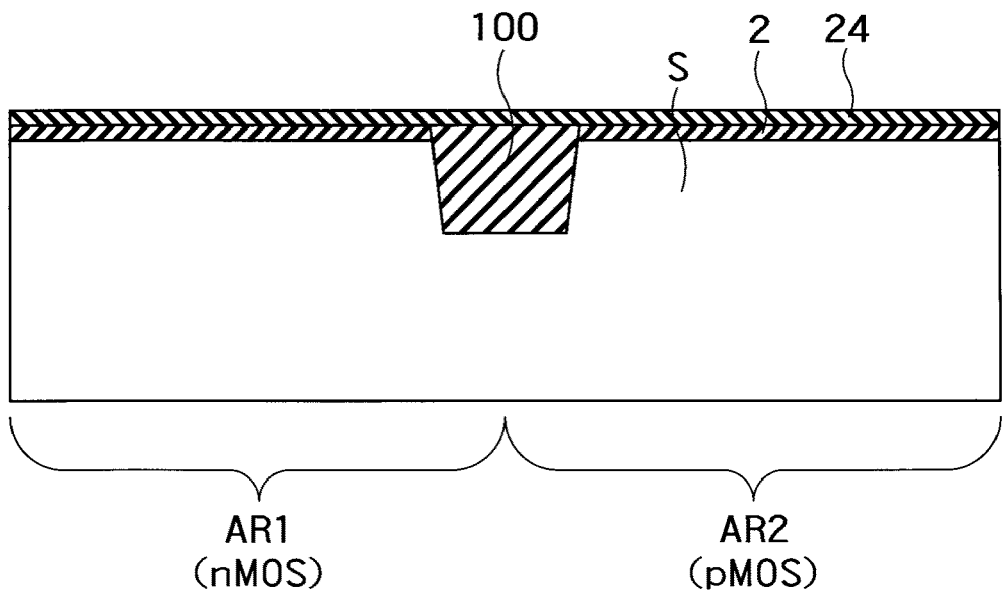
FIGS. 14 to 22 are schematic cross-sectional views for explaining a manufacturing method of the semiconductor device depicted in FIG. 13.

Then, as shown in FIG. 14, the lanthanum oxide ($La_2O_3$) film 24 having a thickness of 0.3 nm is deposited on the entire surface.

Figure 15:
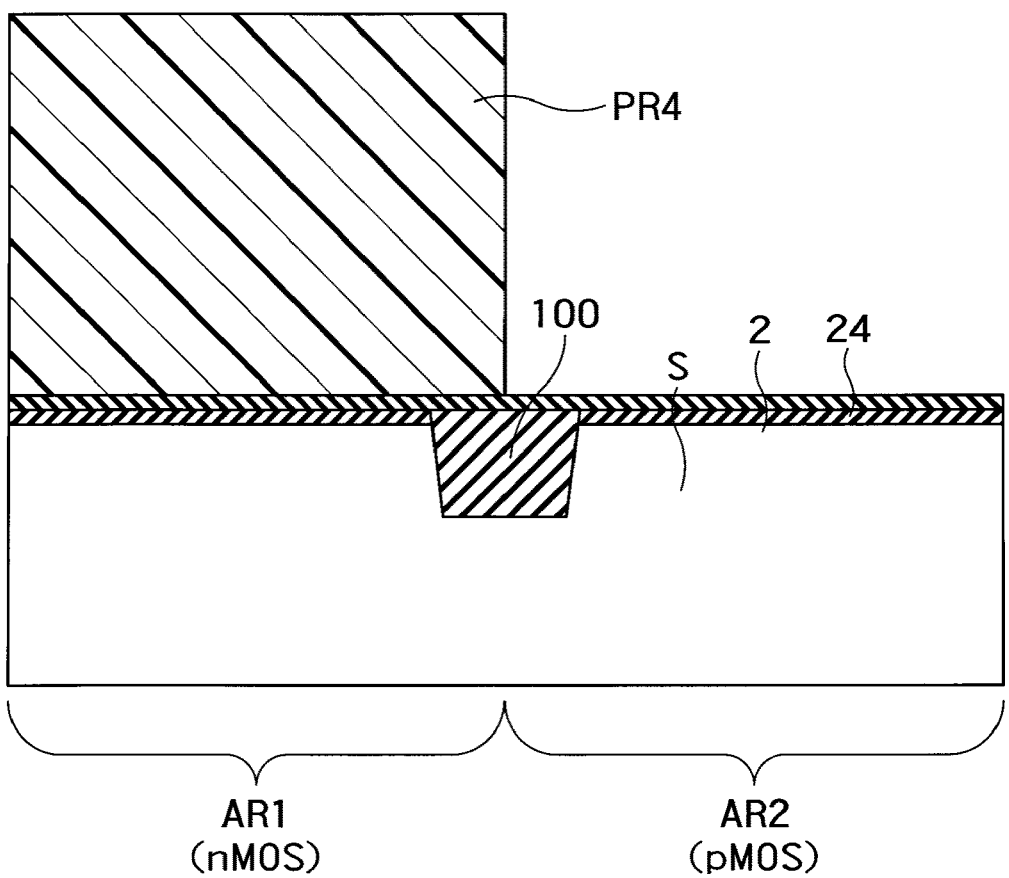
Figure 16:
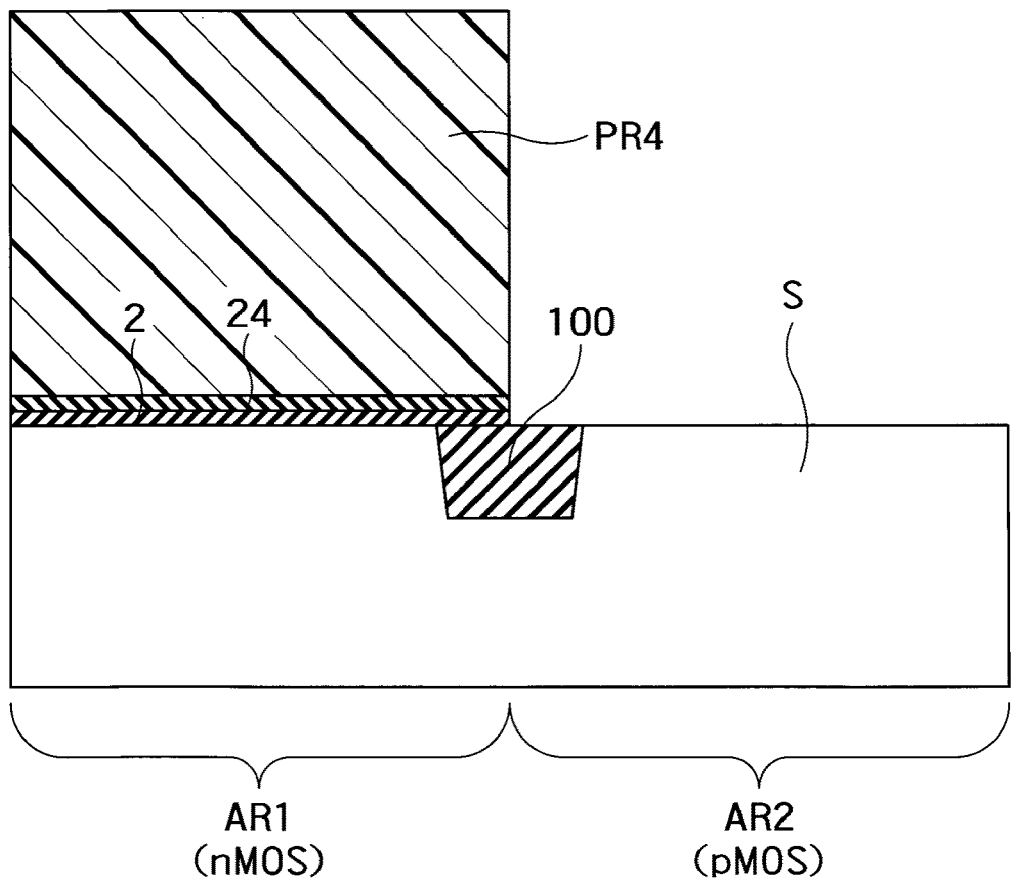

Subsequently, as shown in FIG. 15, a resist film is applied to an entire surface, then a photoresist PR4 that covers the first region AR1 is formed based on patterning using photolithography, and the lanthanum oxide ($La_2O_3$) film 24 and the silicon oxide film 2 are selectively removed in the second region AR2 by using, e.g., a diluted hydrochloric acid solution as shown in FIG. 16.

Figure 17:
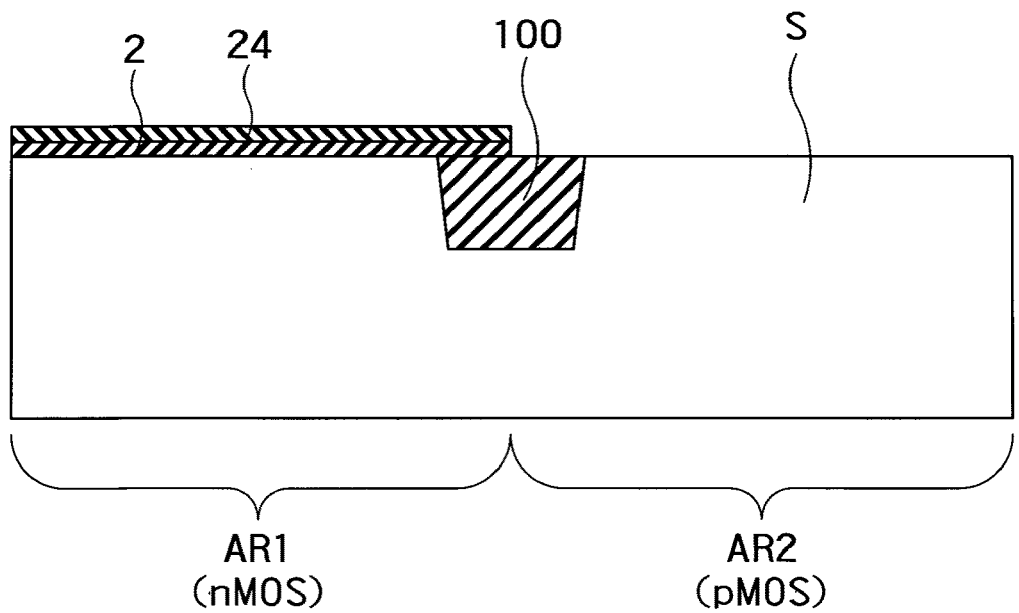
Figure 18:
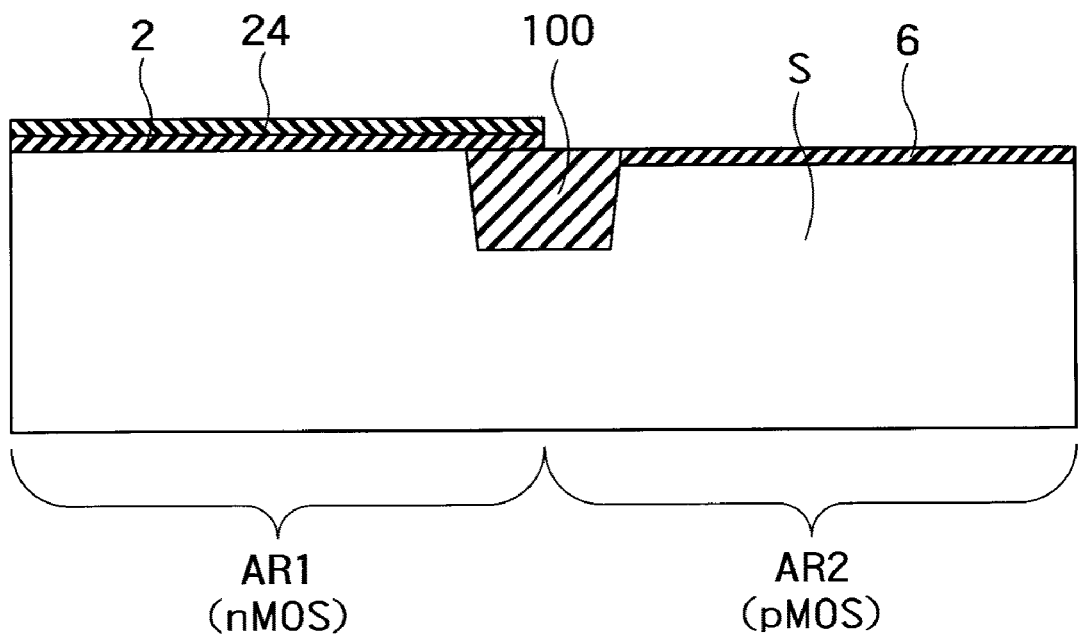

Then, the photoresist PR4 is removed by using, e.g., a thinner as shown in FIG. 17, and a thermal oxidation treatment or an ozone water oxidation treatment is again used to form the silicon oxide film 6 having a thickness of approximately 0.6 nm in the second region AR2 on the surface of the p-type semiconductor substrate S1 as shown in FIG. 18.

Figure 19:
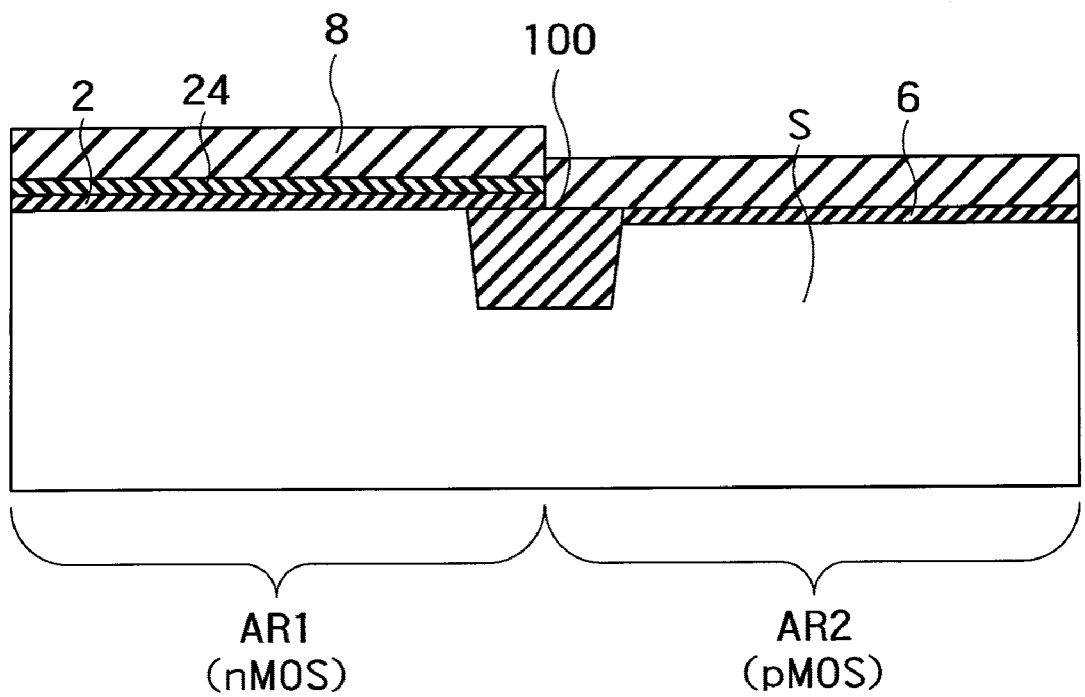

Subsequently, a hafnium silicate (HfSiO) film having a thickness of approximately 2 nm is deposited on the entire surface, nitrogen is introduced by a plasma nitridation method, and a heat treatment is carried out at a temperature of 1000° C. under a pressure of five Torr for 10 seconds to stabilize the introduced nitrogen, thereby forming a hafnium silicon oxynitride (HfSiON) film 8 on the entire surface as depicted in FIG. 19.

Figure 20:
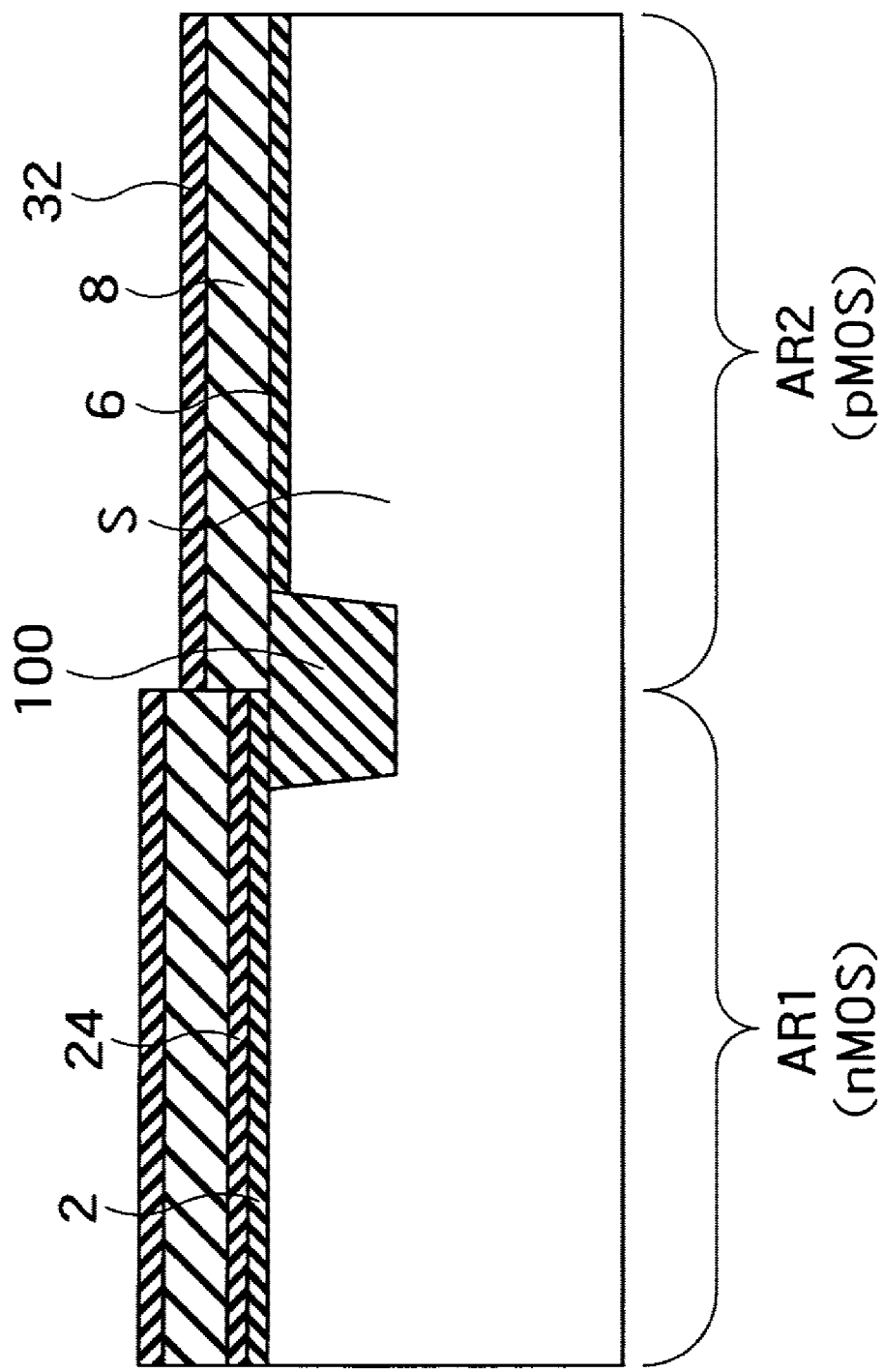

Then, as shown in FIG. 20, a PVD (Physical Vapor Deposition) method or an ALD method is used to deposit an aluminum oxide ($Al_2O_3$) film 32 having a thickness of approximately 1.5 nm on the hafnium silicon oxynitride (HfSiON) film 8.

Figure 21:
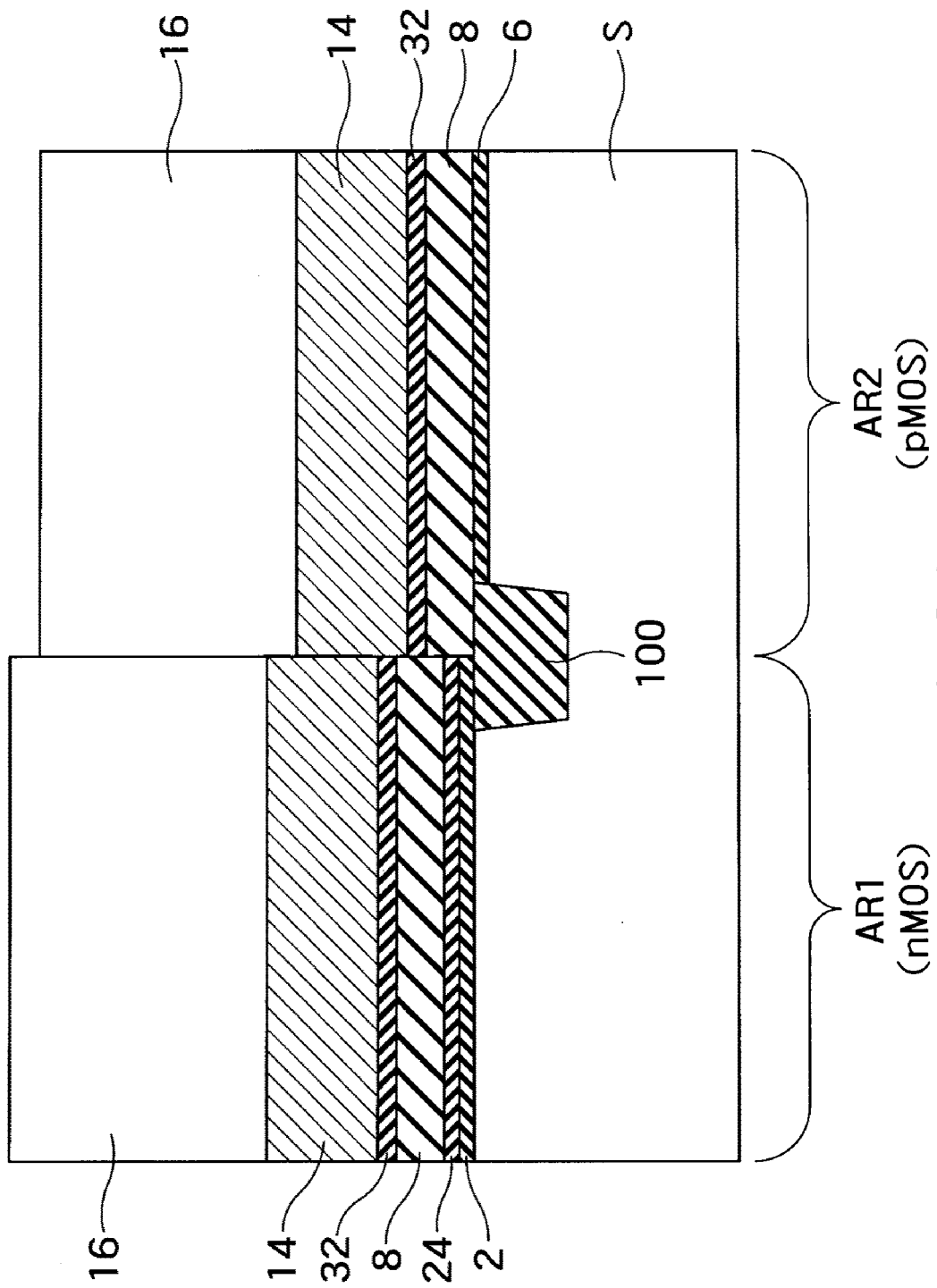
Figure 22:
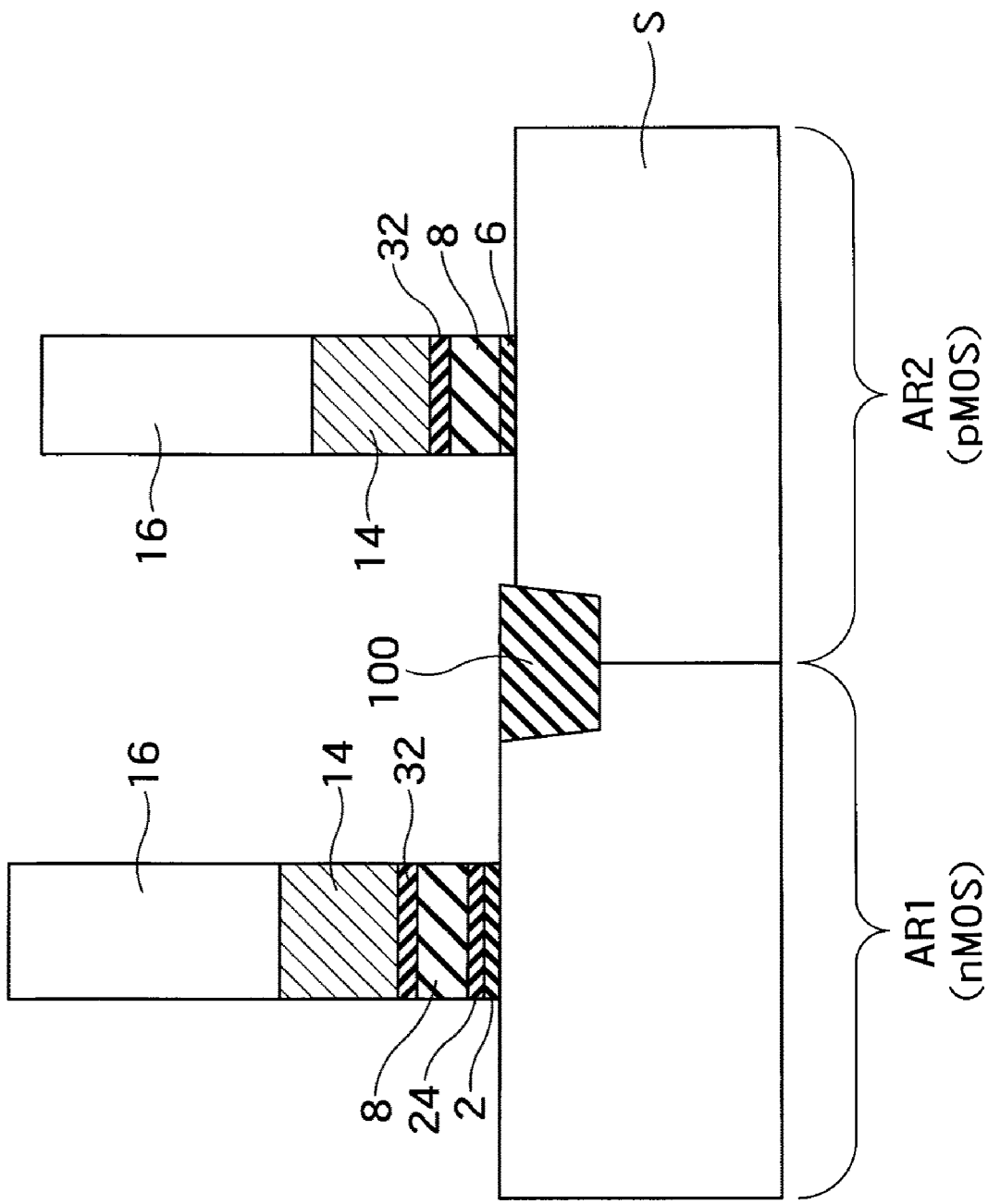

Further, as shown in FIG. 21, the titanium nitride (TiN) film 14 having a thickness of approximately 10 mm and the polysilicon film 16 having a film thickness of 70 nm serving as a gate electrode are deposited on the aluminum oxide ($Al_2O_3$) film 32, and these films are processed into the gate electrode based on the RIE method, thereby bringing a basic structure of a gate stack to completion as depicted in FIG. 22.

Thereafter, the sidewall SW is formed by using a regular process technology, and an MOS type transistor is brought to completion like the semiconductor device 3 depicted in FIG. 13 through ion implantation and an activation annealing process for formation of the impurity diffusion layers 82 and 92 as a source and a drain. With the thermal process described thus far, the aluminum oxide ($Al_2O_3$) film 32 deposited on the hafnium silicon oxynitride (HfSiON) film 8 is diffused into the hafnium silicon oxynitride (HfSiON) film 8, thereby forming the hafnium aluminum silicon oxynitride (HfAlSiON) film 40 to completion as shown in FIG. 13.

In the pMOS, when aluminum (Al) in the hafnium aluminum silicon oxynitride (HfAlSiON) film 40 comes into contact with the silicon oxide film 6, electric dipoles are formed, and a desired low threshold voltage Vth is realized with respect to the pMOS, thus forming a PMOS transistor having high performances. On the other hand, in the nMOS, when the lanthanum oxide ($La_2O_3$) film 24 comes into contact with the silicon oxide film 2, electric dipoles in a direction opposite to that in the pMOS is formed, and a desired low threshold voltage Vth (an absolute value) is realized with respect to the nMOS. Since diffusion of aluminum (Al) in the hafnium aluminum silicon oxynitride (HfAlSiON) film 40 on the lanthanum oxide ($La_2O_3$) film 24 is blocked by the lanthanum oxide ($La_2O_3$) film 24 and contact with the silicon oxide film 2 is suppressed, an increase in the threshold voltage Vth of the nMOS by lanthanum (La) is prevented.

Although the aluminum oxide ($Al_2O_3$) film 32 remains on the first region AR1 in this embodiment, the aluminum oxide ($Al_2O_3$) film 32 on the first region AR1 may be selectively removed.

Furthermore, although the aluminum oxide ($Al_2O_3$) film 32 is formed on the hafnium silicon oxynitride (HfSiON) film 8 in the second embodiment, it may be deposited as a hafnium aluminum silicate (HfAlSiO) film. Moreover, after depositing the aluminum oxide ($Al_2O_3$) film 32, a hafnium silicate (HfSiO) film may be deposited, and then a nitridation treatment and an annealing treatment may be carried out. At this time, the aluminum oxide ($Al_2O_3$) film 32 deposited on the lanthanum oxide ($La_2O_3$) film 24 in the first region AR1 may be selectively removed.

Although the hafnium silicate (HfSiO) film is used to form the hafnium aluminum silicon oxynitride (HfAlSiON) film 40 as the high-dielectric-constant gate insulating film in this embodiment, the present invention is not restricted thereto, and the same effect can be obtained when, e.g., a zirconium silicate (ZrSiO) film, a hafnium oxide film ($HfO_2$), a zirconium oxide ($ZrO_2$) film, a hafnium zirconium oxide film (HfZrO), or a hafnium zirconium silicate film (HfZrSiO) is used.

It is to be noted that, like the first embodiment, before forming the silicon oxide film 2, selectively forming a silicon germanium epitaxial layer serving as a part of a channel on the surface of the second region AR2 of the p-type silicon substrate S enables further reducing the threshold voltage Vth of the pMOS.

Although the several embodiments of the present invention have been explained, the present invention is not restricted to the foregoing embodiments, and it can be of course modified and carried out in many ways within the technical scope thereof. For example, although the p-type semiconductor substrate S is used as the substrate in the foregoing embodiments, the present invention is not restricted thereto, and a glass substrate or a ceramic substrate may be used besides the n-type semiconductor substrate as long as an n-type semiconductor layer and a p-type semiconductor layer are formed on the surface thereof.

What is claimed is:

1. A semiconductor device comprising:
   a substrate having first and second regions on a surface thereof;
   a first conductivity type first MISFET formed in the first region and including:
      a silicon oxide film or a silicon oxynitride film formed on the surface of the substrate, and
      a first insulating film which is formed in contact with the silicon oxide film or the silicon oxynitride film and which has a first element forming electric dipoles that reduce a threshold voltage of the first MISFET; and
   a second conductivity type second MISFET formed in the second region and including:
      a silicon oxide film or a silicon oxynitride film formed on the surface of the substrate,
      a second insulating film which is formed in contact with the silicon oxide film or the silicon oxynitride film formed on the surface of the substrate and which has a second element forming electric dipoles in a direction opposite to that in the first MISFET, and
      a third insulating film which is formed above the silicon oxide film or the silicon oxynitride film so as to come in contact with the second insulating film and has the same composition as the first element,
   wherein the second element contains aluminum.

2. The semiconductor device according to claim 1,
   wherein the first element contains a rare-earth element or a second group element, and hafnium or zirconium.

3. The semiconductor device according to claim 1,
   wherein the first insulating film and the second insulating film are formed in layers different from each other.

4. A semiconductor device comprising:
   a substrate having first and second regions on a surface thereof;
   a first conductivity type first MISFET formed in the first region and including:
      a silicon oxide film or a silicon oxynitride film formed on the surface of the substrate, and
      a first insulating film which is formed in contact with the silicon oxide film or the silicon oxynitride film and which has a first element forming electric dipoles that reduce a threshold voltage of the first MISFET; and
   a second conductivity type second MISFET formed in the second region and including:
      a silicon oxide film or a silicon oxynitride film formed on the surface of the substrate,
      a second insulating film which is formed in contact with the silicon oxide film or the silicon oxynitride film formed on the surface of the substrate and which has a second element forming electric dipoles in a direction opposite to that in the first MISFET, and
      a third insulating film which is formed above the silicon oxide film or the silicon oxynitride film so as to come in contact with the second insulating film and has the same composition as the first element,
   wherein the first element contains a rare-earth element or a second group element.

5. The semiconductor device according to claim 4,
   wherein the second element contains aluminum and hafnium or zirconium.

6. The semiconductor device according to claim 4,
   wherein the first MISFET further includes a fourth insulating film which is formed above the silicon oxide film or the silicon oxynitride film so as to come into contact with the first insulating film and has the first element.

* * * * *